(12) United States Patent
Toyoda

(10) Patent No.: US 10,454,055 B2
(45) Date of Patent: Oct. 22, 2019

(54) DISPLAY DEVICE AND METHOD FOR MANUFACTURING DISPLAY DEVICE

(71) Applicant: Japan Display Inc., Minato-ku (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/938,045

(22) Filed: Mar. 28, 2018

(65) Prior Publication Data

US 2018/0294424 A1 Oct. 11, 2018

(30) Foreign Application Priority Data

Apr. 11, 2017 (JP) ................................. 2017-078020

(51) Int. Cl.
*H01L 51/00* (2006.01)
*H01L 51/50* (2006.01)
*H01L 51/56* (2006.01)
*H01L 27/32* (2006.01)

(52) U.S. Cl.
CPC .......... *H01L 51/506* (2013.01); *H01L 51/002* (2013.01); *H01L 51/5064* (2013.01); *H01L 51/56* (2013.01); *H01L 27/3211* (2013.01); *H01L 27/3246* (2013.01); *H01L 2227/323* (2013.01)

(58) Field of Classification Search
CPC . H01L 51/506; H01L 27/3246; H01L 51/002; H01L 51/5064; H01L 51/56
See application file for complete search history.

(56) References Cited

U.S. PATENT DOCUMENTS

| | | | |
|---|---|---|---|
| 2004/0251816 | A1 | 12/2004 | Leo et al. |
| 2014/0070185 | A1* | 3/2014 | Im .................... H01L 51/5064 257/40 |
| 2016/0027961 | A1* | 1/2016 | Mi ........................ H01L 33/06 257/13 |
| 2018/0261785 | A1* | 9/2018 | Ahmed ................ H01L 51/508 |

FOREIGN PATENT DOCUMENTS

JP 2004-537149 12/2004

* cited by examiner

*Primary Examiner* — Victor A Mandala
*Assistant Examiner* — Colleen E Snow
(74) *Attorney, Agent, or Firm* — Oblon, McClelland, Maier & Neustadt, L.L.P.

(57) ABSTRACT

To provide a display device including a plurality of pixels; a light emitting element layer formed across the plurality of pixels; and a bank formed so as to separately define adjacent pixels among the plurality of pixels, wherein the light emitting element layer includes a p-doped hole transport layer containing p-dopant, and the p-doped hole transport layer is formed on each of the pixels such that the p-doped hole transport layers on the respective adjacent pixels are separated from each other on the bank.

7 Claims, 6 Drawing Sheets

DISPLAY DEVICE AND METHOD FOR MANUFACTURING DISPLAY DEVICE

CROSS-REFERENCE TO RELATED APPLICATION

The present application claims priority from Japanese application JP2017-078020 filed on Apr. 11, 2017, the content of which is hereby incorporated by reference into this application.

BACKGROUND OF THE INVENTION

1. Field of the Invention

The present invention relates to display devices, and a method for manufacturing the display devices.

2. Description of the Related Art

Some display devices include a light emitting element layer including a lower electrode (an anode electrode), a light emissive layer formed on the lower electrode, and an upper electrode (a cathode electrode) formed on the light emissive layer. A light emitting element layer formed across a plurality of pixels is known. A light emitting element layer including a hole transport layer for transporting holes from a lower electrode to a light emissive layer is known. A hole transport layer containing p-dopant including organic material is known (for example, JP2004-537149). The hole transport layer containing p-dopant has high hole transport capability. When such a hole transport layer containing p-dopant is formed across pixels, charge may leak into an adjacent pixel, which possibly causes unintended light emission from the adjacent pixel. Resultantly, color mixture (electric color mixture) may result, and display quality may be possibly deteriorated.

SUMMARY OF THE INVENTION

To address the above problem, it is an object of the present invention to prevent deterioration in display quality due to charge leakage to an adjacent pixel.

According to one aspect of the present invention, there is provided a display device including a plurality of pixels; a light emitting element layer formed across the plurality of pixels; and an insulating layer formed so as to separately define adjacent pixels among the plurality of pixels, wherein the light emitting element layer includes a p-doped hole transport layer containing p-dopant, and the p-doped hole transport layer is formed on each of the pixel such that the p-doped hole transport layers on the respective adjacent pixels are separated from each other on the insulating layer.

According to another aspect of the present invention, there is provided a method for manufacturing a display device, the method including a step of forming an insulating layer so as to separately define adjacent pixels among a plurality of pixels; a step of forming a hole transport layer across the plurality of pixels;

and a step of injecting p-dopant into the hole transport layer so as to form a p-doped hole transport layer on each of the pixels such that the p-doped hole transport layers on the respective adjacent pixels are separated from each other on the insulating layer.

DETAILED DESCRIPTION OF THE INVENTION

Figure 1:
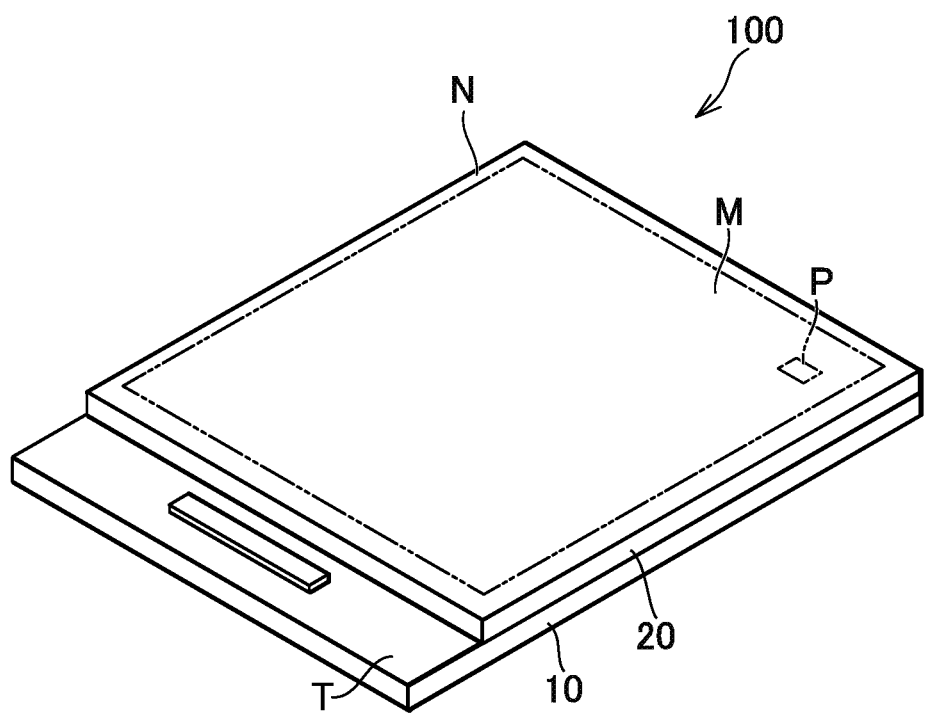
FIG. 1 is a perspective view of a complete structure of a display device according to this embodiment.

The following describes an embodiment of the present invention (hereinafter referred to as this embodiment) while referring to the drawings. The present invention can be rendered into practice in various aspects without departing from the gist of the present invention. The present invention should not be interpreted as being limited to the description of the embodiment below.

The respective widths, thicknesses, shapes, and so forth may be illustrated more schematically in the drawings, compared with actual widths, thicknesses, shapes, and so forth in order to make clearer the description of the present invention. These, however, are mere examples, and should not limit interpretation of the present invention in any way. In the specification and drawings, any elements having the same functions as those having been described earlier with respect to a drawing referred to earlier are given the same reference numerals, and may not be described in detail again.

In the detailed description of an embodiment of the present invention, the terms "on" and "under" appearing in the description that defines positional relationships between structural components refer to not only a case in which a first component is disposed directly on or under a second component but also a case in which a first structural component is disposed on or under a second structural component with a third structural component in-between unless otherwise stated.

FIG. 1 is a schematic perspective view of a complete structure of a display device according to an embodiment. An organic electro-luminescent display device will be described below as an example of a display device. A display device 100 displays a full-color image P with combination of pixels for a plurality of colors, including red, green, and blue.

As illustrated in FIG. 1, the display device 100 includes a circuit substrate 10 and a counter substrate 20. The counter substrate 20 is disposed opposed to the circuit substrate 10 with a filling layer 30 in-between (see FIGS. 2 and 3).

The circuit substrate 10 has a display area M, a frame area N around the display area M, and a terminal area T. The display area M has a plurality of pixels P thereon disposed in a matrix. Although only a single pixel P is illustrated in FIG. 1, the pixels P are disposed in the substantially entire display area M. The terminal area T has an integrated circuit chip thereon for driving an element to display an image. A flexible wire substrate or the like (not illustrated) may be connected to the terminal area T for electrical connection to external components.

Figure 2:
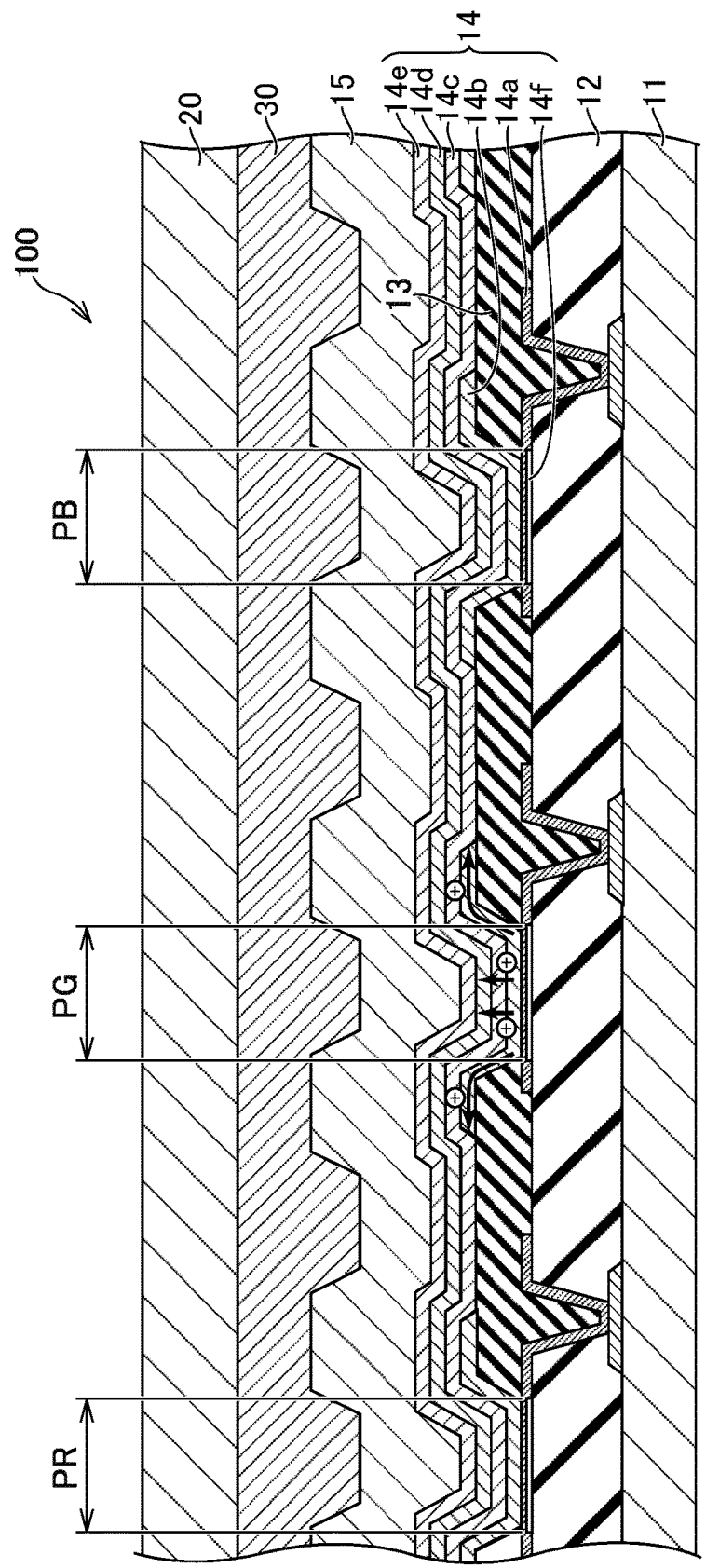
FIG. 2 is a schematic cross-sectional view of a circuit board according to this embodiment FIG. 3 schematically illustrates the laminated structure of a display device according to this embodiment.

FIG. 2 is a schematic cross-sectional view of a display device according to this embodiment. The circuit substrate 10 includes a substrate 11, an insulating planarization layer 12, an insulating bank (an insulating layer) 13, a light emitting element layer 14, and a sealing layer 15. The light emitting element layer 14 includes at least an anode electrode (a lower electrode) 14a, a p-doped hole transport layer (p-doped HTL) 14b, a hole transport layer (HTL) 14c, a light emissive layer (EML) 14d, and a cathode electrode (an upper electrode) 14e.

The substrate 11 includes a thin film transistor and a lower layer, preferably, made using a glass substrate or a resin substrate, with detailed structure thereof not illustrated. A planarization layer 12 is formed on the substrate 11, making flat the anode electrode 14 and a reflection metal 14f disposed as a lower layer of the anode electrode 14a. The planarization layer 12 may be made of organic material such as photosensitivity acrylic resin. The bank 13 is formed to define respective pixels P. Specifically, the bank 13 is formed so as to separate the anode electrode 14a and a part of the light emitting element layer 14 (a p-doped hole transport layer 14b). The bank 13 has an opening in which the anode electrode 14a is partially exposed.

The light emissive layer 14d is formed, for example, through deposition. The light emissive layer 14d emits light in an area where the anode electrode 14a is in contact with the p-doped hole transport layer 14b, but does not emit light in an area where the anode electrode 14a is separated from the p-doped hole transport layer 14b. The sealing layer 15 prevents invasion of moisture from outside into the light emissive layer 14d and includes at least one inorganic insulating layer made of, for example, silicon nitride (SiN). The sealing layer 15 may have a laminated structure including a plurality of insulating layers. The cathode electrode 14e, the sealing layer 15, and the like, are formed over the substantially entire display area M across a plurality of pixels P. The anode electrode 14a is provided to each of the plurality of pixels P (a red pixel PR, a green pixel PG, and a blue pixel PB). The anode electrode 14a is electrically connected to a wire layer through a contact hole that penetrates the planarization layer 12.

The anode electrode 14a may be made of transparent material, such as, for example, indium tin oxide (ITO). Under the anode electrode 14a, the reflection metal 14f, such as silver or aluminum, that reflects light may be disposed. The cathode electrode 14e may be made of transparent material, such as ITO, similar to the anode electrode 14a.

Figure 3:
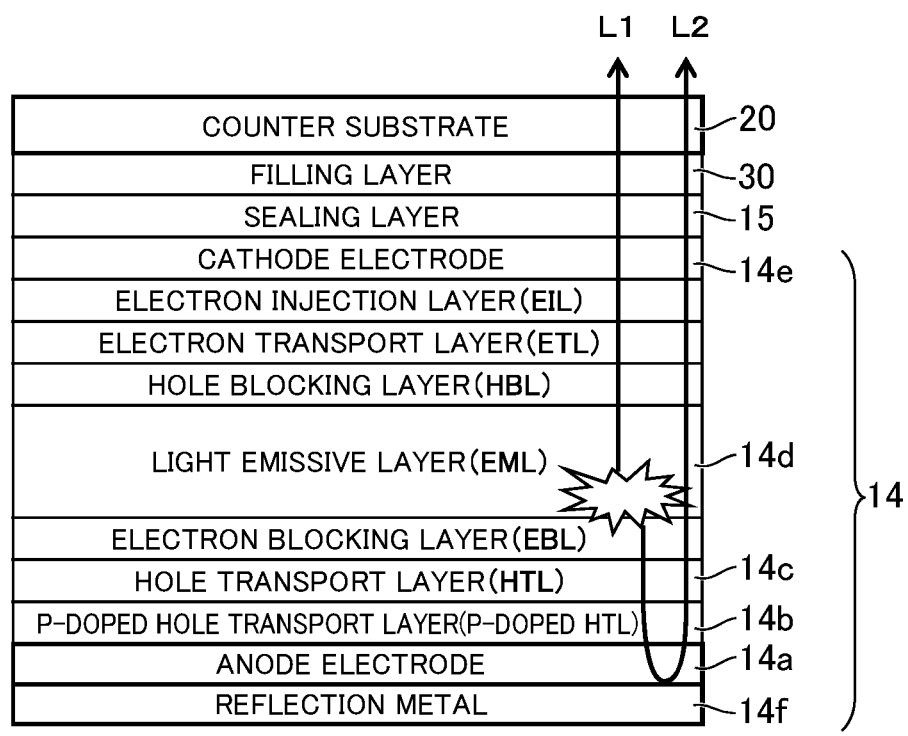

FIG. 3 schematically illustrates the laminated structure of a display device according to this embodiment. The light emitting element layer 14 may include an electron blocking layer (EBL), a hole blocking layer (HBL), an electron transport layer (ETL), an electron injection layer (EIL), as illustrated in FIG. 3, in addition to the above mentioned anode electrode 14a, p-doped hole transport layer 14b, hole transport layer 14c, light emissive layer 14d, cathode electrode 14e, and reflection metal 14f. As illustrated in FIG. 3, these layers may be stacked in the order of the reflection metal 14f, the anode electrode 14a, the p-doped hole transport layer 14b, the hole transport layer 14c, the electron blocking layer, the light emissive layer 14d, the hole blocking layer, the electron transport layer, the electron injection layer, and the cathode electrode 14e from the bottom to the top.

The following describes the light emitting principle for the display device 100. With a voltage applied to the anode electrode 14a and the cathode electrode 14e on the respective upper and lower sides of the light emissive layer 14d, holes having positive charge move from the anode electrode 14a through the p-doped hole transport layer 14b and the hole transport layer 14c into the light emissive layer 14d, while electrons having negative charge move from the cathode electrode 14e through the electron injection layer and the electron transport layer into the light emissive layer 14d. The holes having moved from the anode electrode 14a into the light emissive layer 14d will not move beyond the light emissive layer 14d toward the cathode electrode 14e as being blocked by the hole blocking layer formed on the light emissive layer 14d. Meanwhile, the electrons having moved from the cathode electrode 14e into the light emissive layer 14d will not move beyond the light emissive layer 14d toward the anode electrode 14a as an electron blocking layer is formed under the light emissive layer 14d.

In the light emissive layer 14d, an electron is combined with a hole. The combination generates an energy, which excites particles around. The particles in the excited state return to the ground state. In the return, light is emitted with the energy being discharged. In other words, electrons are re-combined with holes in the light emissive layer 14d, and the recombination excites the organic material forming the light emissive layer 14d. With the excitement, an energy state shifts from a high energy level to a low energy level, whereby light is emitted.

As illustrated in FIG. 3, the light from the light emissive layer 14d partially proceeds toward the display surface (toward the counter substrate 20). The light L1 proceeding toward the display surface is extracted from the display surface to outside the display device 100. Meanwhile, the light proceeding from the light emissive layer 14d partially proceeds in the direction opposite from the display surface. The light L2 proceeding in the direction opposite from the display surface is reflected by the reflection metal 14f, and then extracted from the display surface to outside the display device 100. Alternatively, the reflection metal 14f may be omitted. In this case, the anode electrode 14a is made of material that reflects light, so that the light L2 is reflected on the surface of the anode electrode 14a.

The light emissive layer 14d may be made of material that emits white light. In addition, for example, a color filter is disposed on the counter substrate 20 so as to correspond to each of the pixels P (PR, PG, PB). Use of a color filter that passes red light, a color filter that passes green light, and a color filter that passes blue light enables display of a full-color image. Alternatively, instead of using a color filter, the light emissive layer 14d is formed using materials that emit red, green, blue respective light beams, and a resultant light emissive layer 14d is disposed so as to correspond to each pixel P.

Figure 4A:
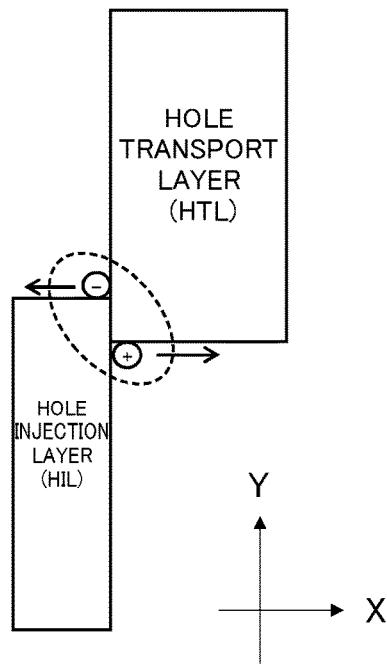
FIG. 4A is a conceptual diagram to explain the mechanism for hole transport according to a conventional technique.
Figure 4B:
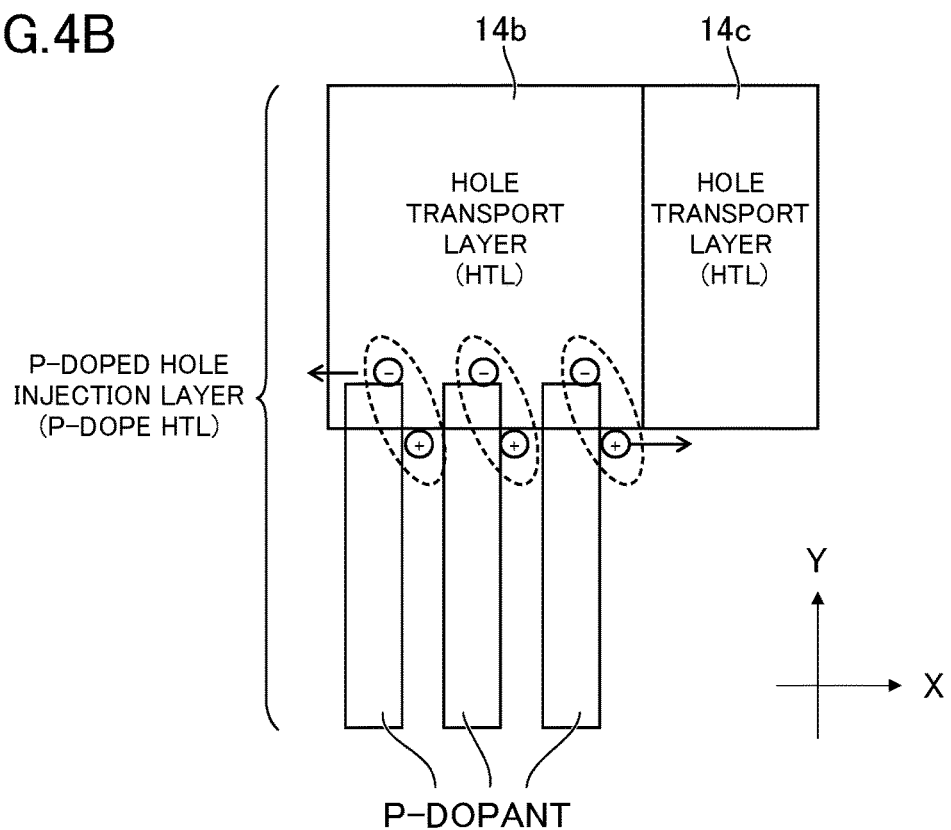
FIG. 4B is a conceptual diagram to explain the mechanism for hole transport according to this embodiment.

The following describes the hole transport mechanism in this embodiment, based on a comparison with conventional technique, while referring to FIG. 4. FIG. 4A is a conceptual diagram to explain a hole transport mechanism according to a conventional technique. FIG. 4B is a conceptual diagram to explain the hole transport mechanism in this embodiment. In FIGS. 4A and 4B, the direction Y indicates the magnitude of the energy (eV), in which the side of each layer on the positive side of the direction Y corresponds to the Lowest Unoccupied Molecular Orbital (LUMO), while the side of each layer on the negative side of the direction Y corresponds to the Highest Unoccupied Molecular Orbital (HUMO). In FIG. 4A and FIG. 4B, the positive side of the direction X corresponds to the cathode electrode 14e side, while the negative side of the direction Y corresponds to the anode electrode 14a side.

According to the conventional technique, a hole injection layer (HIL) is formed under the hole transport layer 14c. The hole injection layer generates holes and electrodes through charge separation along the interface relative to an adjacent hole transport layer. The hole injection layer may be made of hole injection material, such as 2,3,6,7,10,11-(Hexacyano)-1,4,5,8,9,12-(hexaazatriphenylene) (HAT-CN), copper hexadecafluoro-phthalocyanine ($F_{16}CuPc$), or the like. The LUMO of the hole filling material has a value relatively close to that of the HOMO of the hole transport material forming the hole transport layer.

In this embodiment, a p-doped hole transport layer 14b, that is, a layer formed by injecting p-dopant including organic material into a hole transport layer, is formed under the hole transport layer 14c, instead of a hole injection layer made of the above mentioned hole injection material. The hole transport layer 14c transports holes to the light emissive layer 14d. The p-doped hole transport layer 14b containing p-dopant generates holes and electrons through charge separation in a bulk of the hole transport layer where the p-dopant is contained in the p-doped hole transport layer 14b, and transports the holes to the light emissive layer 14d.

The hole transport material forming the hole transport layer may include, for example, 1-bis-di-4-tolylamino-phenyl-cyclohexane (TAPC), N,N'-bis(3-methylphenyl)-N,N'-diphenylbenzidine (TPD), bis(N-((1-naphtyl)-N-phenyl) benzidine (α-NPD), 4,4',4''-tris(3-methylphenylphenylamino)triphenylamine (m-MTDATA), Triphenylamine-tetramer (TPTE), 2,2',7,7'-tetrakis(N,N-diphenylamino)-9,9'-spirobifluorene (spiro-TAD). P-dopant may be molybdenum oxide ($MoO_3$), rhenium oxide ($Re_2O_7$), fluorinated Tetracyanoquinodimethane ($F_4$-TCNQ). The value of the energy level of the HOMO of the hole transport material is about 5.0 to 5.5 (eV), which is relatively close to that of the LUMO of p-dopant.

With a voltage applied to the anode electrode 14a and the cathode electrode 14e, holes having positive (+) charge and electrons having negative (−) charge are generated through charge separation. As illustrated in FIG. 4A, according to a conventional technique, holes and electrons are generated through charge separation along the interface between the hole transport layer 14c and the hole injection layer, and the holes move toward the cathode electrode 14e (the positive side of the direction X). Meanwhile, in this embodiment, holes and electrons are generated through charge separation in a bulk of the hole transport layer where the p-doped material is contained in the p-doped hole transport layer 14b, and the holes move toward the cathode electrode 14e (the positive side of the direction X).

In a conventional structure, charge separation is caused only along the interface between the hole transport layer 14c and the hole injection layer, while, in this embodiment, charge separation is caused in the bulk of the hole transport layer and the p-dopant in the hole transport layer in the p-doped hole transport layer 14b, which result in a larger number of occurrences of charge separation. Accordingly, in this embodiment, a larger number of holes than that according to the conventional technique are generated, so that higher hole transport capability (hole injecting capability) can be obtained. In other words, in this embodiment, it is possible to transport holes toward the light emissive layer 14d with a lower voltage. The larger the amount of p-dopant to be injected is, the higher the hole transport capability of the p-doped hole transport layer 14b is.

The hole injection layer may be made of organic material containing fluorine. Fluorine-based particles, however, have low surface tension, and can provide only insufficient adhesion. This rises a problem in that the hole injection layer is easily detached from the anode electrode 14a. Meanwhile, a hole injection layer made of metal or oxide can provide only insufficient permeability. This rises a problem in that light emitting efficiency is low. In view of the above, use of the p-doped hole transport layer 14b containing no fluorine, as in this embodiment, instead of use of a hole injection layer, can solve the problem with adhesion and permeability.

Figure 5:
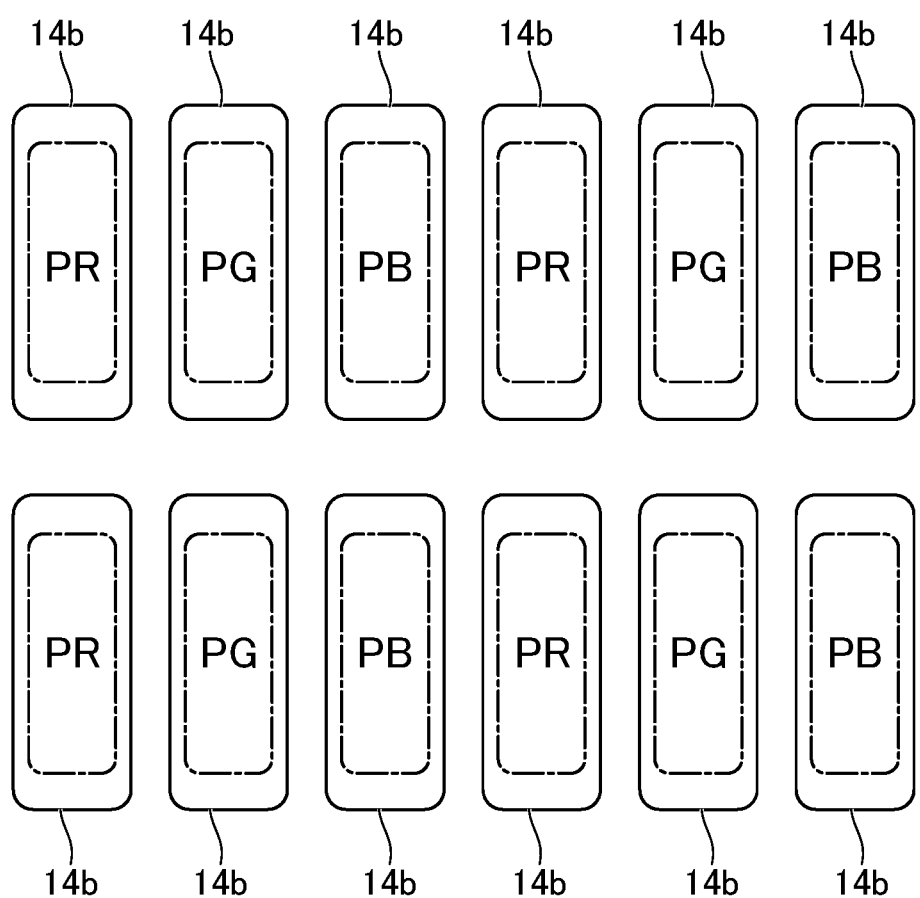
FIG. 5 is a plan view illustrating disposition of p-doped hole transport layers.

The following describes details of a structure of a p-doped hole transport layer in this embodiment, referring to FIGS. 2 and 5. FIG. 5 is a plan view illustrating disposition of p-doped hole transport layers. In this embodiment, as illustrated in FIGS. 2 and 5, a green pixel PG is disposed adjacent to a red pixel PR and a blue pixel PB. This disposition, however, is not an exclusive example. The p-doped hole transport layer 14b is formed so as to be disposed on each of the pixels P such that the p-doped hole transport layers 14b for the respective adjacent pixels P are separated from each other. As illustrated in FIG. 2, the p-doped hole transport layer 14b is formed on the anode electrode 14a exposed in the bank 13 and an area close to an end portion of the opening of the bank 13. FIG. 5 illustrates only disposition of the pixels P and that of the p-doped hole transport layers 14b, with the hole transport layer 14c, the light emissive layer 14d, the cathode electrode 14e, the sealing layer 15, or the like, disposed on the p-doped hole transport layer 14b across a plurality of pixels P (PR, PG, PB), not illustrated.

As described above, the structure employing the p-doped hole transport layer 14c in this embodiment has higher hole transport capability, compared with that of a conventional structure employing a hole injection layer. Because of this high hole transport capability, in the case where such a p-dopant transport layer is formed across a plurality of pixels P, charge can leak from the p-doped transport layer to an adjacent pixel. This can cause unintended light emission from the adjacent pixel. This causes color mixture and possibly deteriorates color purity and contrast. As a result, display quality can be deteriorated. In particular, in the case where adjacent pixels emit light in different colors, significant deterioration in display quality can result.

In view of the above, in this embodiment, the p-dopoed hole transport layer 14b is formed on each of the pixels P such that the p-doped hole transport layers 14b for the respective adjacent pixels P are separated from each other on the bank 13. This structure does not allow holes to move in an area where the p-doped hole transport layers 14b are discontinuous. The arrows in FIG. 2 indicate the direction in which a hole having positive charge (+) generated in a green pixel PG moves. Some of the holes generated in the green pixel PG move through the p-doped hole transport layer 14b toward the adjacent red pixel PR and blue pixel PB. However, because the p-doped hole transport layers 14b are discontinuous from each other on the bank 13 between the green pixel PG and the red pixel PR and between the green pixel PG and the blue pixel PB, respectively, holes cannot move through the p-doped hole transport layer 14b into adjacent pixels. Employment of this structure in this embodiment can prevent charge leakage to an adjacent pixel P. Accordingly, color mixture (electric color mixture) is unlikely caused, and display quality can thus improve.

Figure 6:
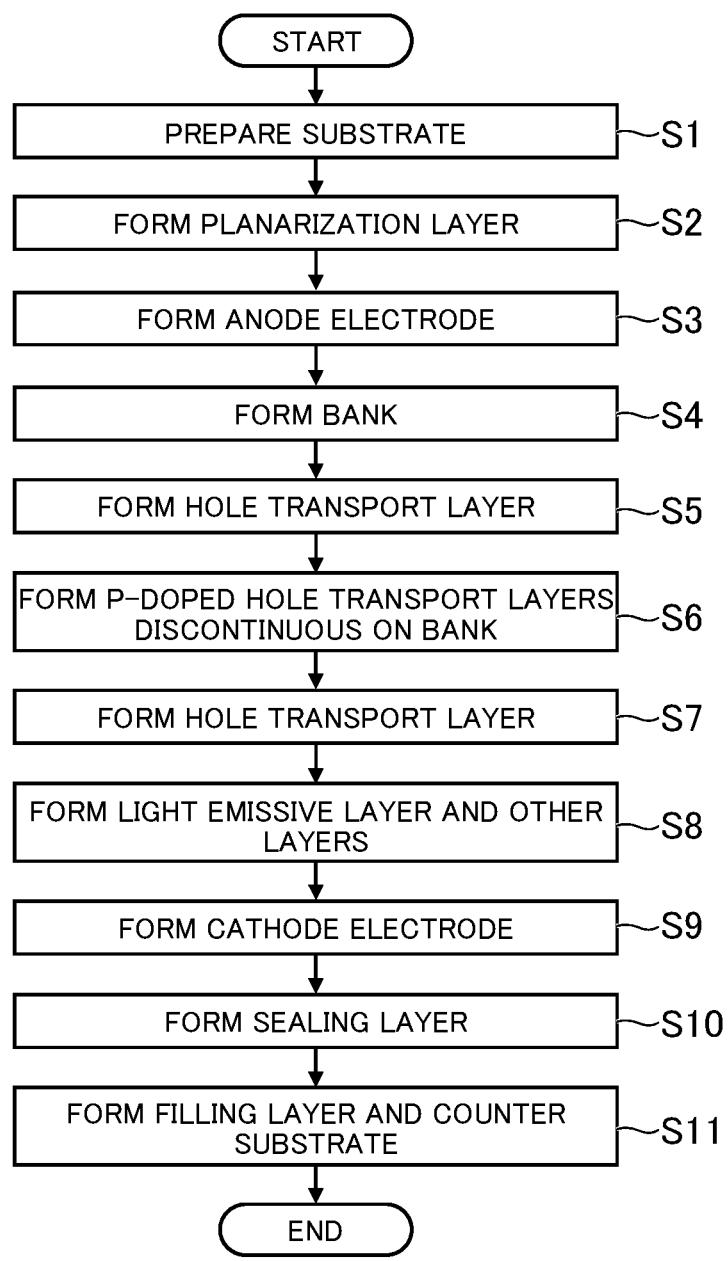
FIG. 6 is a flowchart to explain a method for manufacturing a display device according to this embodiment.

The following describes a method for manufacturing the display device 100 referring to FIG. 6. FIG. 6 is a flowchart to explain a method for manufacturing a display device according to this embodiment.

Initially, the substrate 11 is prepared (step S1). The planarization layer 12 is formed on the substrate 11 (step S2). The anode electrode 14a is formed on the planarization layer 12 (step S3). The bank 13 is formed on the planarization layer 12 and the anode electrode 14a. The bank 13 separately defines adjacent pixels P and includes an opening, in which the anode electrode 14a is partly exposed, is formed (step S4). A hole transport layer is formed across the plurality of pixels P (step S5).

P-dopant is injected into the hole transport layer to thereby form a p-doped hole transport layer 14b containing p-dopant (step S6). In the above, the p-doped hole transport layers 14b are formed discontinuous from each other on the bank 13 (step S6). This process of forming p-doped hole transport layers discontinuous from each other on the bank 13 is executed, for example, by depositing a hole transport layer on the anode 14a and the bank 13 so as to lie across adjacent pixels P (solid film formation), and injecting p-dopant into the deposited hole transport layer with a metal mask or the like placed on the bank 13 to thereby form the p-doped hole transport layer 14b only on the anode electrode 14a and an end portion of the opening of the bank 13. Alternatively, the process may be executed by depositing a hole transport layer on the anode electrode 14a and the bank 13 so as to lie across adjacent pixels P (solid film formation), then injecting p-dopant into the entire hole transport layer deposited, and thereafter removing the p-dopant in the hole transport layer on the bank 13 by laser ablation. Still alternatively, the process may be executed by forming the p-doped hole transport layer 14b so as to lie across a plurality of pixels P, and pressing the p-doped hole transport layer 14b with a cast or the like until the p-doped transport layer 14b on the bank 13 becomes ignorably thin.

Thereafter, the hole transport layer 14c is formed on the p-doped hole transport layer 14b so as to lie across a plurality of pixels P (step S7). Additionally, an electron blocking layer, the light emissive layer 14d, a hole blocking layer, an electron transport layer, and an electron injection layer are formed sequentially from the lower layer side (step S8), and the cathode electrode 14e and the sealing layer 15 are further formed sequentially on the lamination (steps S9 and S10). Thereafter, the filling layer 30 and the counter substrate 20 are formed in this order on the sealing layer 15 (step S11).

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
    a plurality of pixels;
    a light emitting element layer formed across the plurality of pixels; and
    an insulating layer formed so as to separately define adjacent pixels among the plurality of pixels,
    wherein
    the light emitting element layer includes a p-doped hole transport layer containing p-dopant, and
    the p-doped hole transport layer is formed on each of the pixels such that the p-doped hole transport layers on respective adjacent pixels are separated from each other on the insulating layer; and
    a hole transport layer formed on the p-doped hole transport layer so as to lie across the plurality of pixels.

2. The display device according to claim 1, wherein the light emitting element layer includes
    a light emissive layer,
    a lower electrode disposed under the light emissive layer, and
    an upper electrode disposed on the light emissive layer, and
    the insulating layer is formed such that a part of the lower electrode is exposed, and
    the p-doped hole transport layer is formed on the part of the lower electrode, the part being exposed in the insulating layer.

3. The display device according to claim 1, wherein the adjacent pixels are pixels for different colors.

4. A method for manufacturing a display device, comprising:
    a step of forming an insulating layer so as to separately define adjacent pixels among a plurality of pixels;
    a step of forming a hole transport layer across the plurality of pixels;
    a step of injecting p-dopant into the hole transport layer so as to form a p-doped hole transport layer on each of the pixel such that the p-doped hole transport layers on respective adjacent pixels are separated from each other on the insulating layer; and
    a step of forming a hole transport layer so as to lie across the plurality of pixels on the p-doped hole transport layer.

5. The method for manufacturing a display device according to claim 4, further comprising a step of forming a lower electrode, the step being executed before the step of forming the insulating layer, wherein
    at the step of forming the insulating layer, the insulating layer is formed such that a part of the lower electrode is exposed, and
    at the step of forming the p-doped hole transport layer, the p-doped hole transport layer is formed on the part of the lower electrode, the part being exposed in the insulating layer.

6. The method for manufacturing a display device according to claim 4, wherein at the step of forming the p-doped hole transport layer, the p-dopant is injected into the hole transport layer with a mask placed on the insulating layer.

7. The method for manufacturing a display device according to claim 4, wherein at the step of forming the p-doped hole transport layer, the p-dopant is injected such that the p-doped transport layer is formed so as to lie across the plurality of pixels, and the p-dopant in the hole transport layer on the insulating layer is thereafter removed.

* * * * *